(12) United States Patent
Van Zeijl

(10) Patent No.: US 6,285,307 B1
(45) Date of Patent: Sep. 4, 2001

(54) METHOD OF AND A DEVICE FOR ANALOG SIGNAL SAMPLING

(75) Inventor: Paulus Thomas Maria Van Zeijl, Hengelo (NL)

(73) Assignee: Telefonaktiebolaget LM Ericsson (publ), Stockholm (SE)

( * ) Notice: Subject to any disclaimer, the term of this patent is extended or adjusted under 35 U.S.C. 154(b) by 0 days.

(21) Appl. No.: 09/380,089

(22) PCT Filed: Jan. 27, 1998

(86) PCT No.: PCT/EP98/00520

§ 371 Date: Jun. 13, 2000

§ 102(e) Date: Jun. 13, 2000

(87) PCT Pub. No.: WO98/38745

PCT Pub. Date: Sep. 3, 1998

(30) Foreign Application Priority Data

Feb. 26, 1997 (EP) .................................. 97200529

(51) Int. Cl.[7] .................................................. H03M 1/12
(52) U.S. Cl. .............................................. 341/155; 341/111
(58) Field of Search .................................. 341/155, 122, 341/111, 123, 162

(56) References Cited

U.S. PATENT DOCUMENTS

| 5,099,243 | 3/1992 | Tsui et al. . |
| 5,631,646 | * 5/1997 | Erhage ............................. 341/120 |
| 5,877,713 | * 3/1999 | Marie ............................... 341/122 |

FOREIGN PATENT DOCUMENTS

| 335037 | 4/1989 | (EP) . |

OTHER PUBLICATIONS

Carlson, A. Bruce, *Communication Systems —an Introduction to Signals and Noise in Electrical Communication*, Second Ed., McGraw–Hill Kogakusha, Ltd. (1975), Chapters 2 & 8.

* cited by examiner

Primary Examiner—Brian Young
(74) Attorney, Agent, or Firm—Burns, Doane, Swecker & Mathis, L.L.P.

(57) ABSTRACT

A method and a device of sampling an analog signal ($U(t)$) by obtaining first sequences of discrete sample values ($S_I^1(t)$, $S_Q^1(t)$) of In-phase (I) and Quadrature-phase (Q) components ($U_I(t)$, $U_Q(t)$) of the analog signall ($U(t)$) and second sequences of discrete sample values ($S_I^2(t)$, $S_Q^2(t)$) of the I and Q components ($U_I(t)$, $U_Q(t)$), by sampling of the I and Q components with sampling sequences ($\phi_1(t)$, $\phi_2(t)$) having equal sampling rate ($\omega_s$) and a mutual phase shift of 90° relative to their sampling rate period (T). The sample values of the I component of the first sequence ($S_I^1(t)$) and the sample values of the Q component of the second sequence ($S_Q^2(t)$) are summed (9) to form a third sequence of sample values $S^3(t)$. The sample values of the Q component of the first sequence ($S_Q^1(t)$) and the sample values of the I component of the second sequence $S_I^2(t)$) are summed (10) to form a fourth sequence of sample values ($S^4(t)$). The third and fourth sequences of sample values ($S^3(t)$, $S^4(t)$) are further processed during an interval of a particular period (T) of the third and fourth sequences ($S^3(t)$, $S^4(t)$) and starting after the sample values of the first and second sequences ($S_I^1(t)$, $S_I^2(t)$, $S_Q^1(t)$, $S_Q^2(t)$) of said period (T) are available.

10 Claims, 3 Drawing Sheets

METHOD OF AND A DEVICE FOR ANALOG SIGNAL SAMPLING

FIELD OF THE INVENTION

The present invention generally relates to signal processing, in particular signal sampling, signal discretization and analog-to-digital conversion in communication devices, such as radio communication devices.

BACKGROUND OF THE INVENTION

Sampling of an analog electric signal consists of both time discretization and amplitude discretization of a time-invariant signal, i.e. a voltage or current.

A simple representation of a sampling operation is a switch, which at a certain rate, i.e. the sampling rate, permits transfer of the analog signal during a short time relative to the sampling period. The thus sampled analog signal than consists of short segments or sample values of the analog signal having an amplitude which corresponds to the amplitude of the analog signal at the time of sampling.

The sampling operation can be represented as a multiplication of the analog signal and a periodic pulse train, the period of which is the sampling rate.

It can be shown that such multiplication operation, in the frequency domain, results in a spectrum of signals comprising the spectrum of the sampled analog signal and a periodic repetition of the spectrum with a spacing determined by the sampling rate and having a decreasing spectral power. The attenuation is determined by the sampling process, i.e. the duration and the amplitude of the pulses of the periodic pulse train and the sampling rate.

The minimum sampling rate at which no overlap of the repeated analog signal is encountered, is called the nominal Nyquist rate. That is, the minimum sampling frequency has to be at least twice the upper frequency of a frequency band limited signal.

A more elaborated discussion on sampling can be found in many textbooks dealing with electric communication such as "Communication Systems", by A. Bruce Carlson, McGraw-Hill 1975, second edition Chapter 8.

In practice, real analog signals are not strictly band limited, such that whenever frequencies occur in the analog signal which are undersampled, that is the Nyquist criterion is not met for such frequencies, a phenomenon occurs which is called aliasing. With aliasing spectral overlap of repeated spectra occurs, such that after reconstruction of the sampled signal, frequencies which were originally outside the frequency band of the sampled signal will now appear at the reconstructed output in the form of lower frequencies, distorting the reconstructed sampled analog signal.

Aliasing is combatted by removing or filtering as much as possible frequency components above the frequency band of the signal to be sampled before the actual sampling thereof and, if possible, sampling at a much higher rate than the nominal Nyquist rate. Such type of filtering is also called anti-aliasing filtering. Reference is made to European patent application 0,335,037.

In practice, there is a compromise between the order of the filter, i.e. a Low Pass (LP) or a Band Pass (BP) filter and the sample rate which may relate to the conversion speed of an Analog-to-Digital Converter (ADC) used, and thus its power consumption.

SUMMARY OF THE INVENTION

It is an object of the present invention to provide a novel method of sampling an analog signal having an improved rejection of spurious frequencies in case of non-strictly bandlimited analog signals.

It is a further object of the present invention to relieve the requirements put on aliasing filters used in the sampling of non-bandlimited analog signals.

It is in particular an object of the present invention to provide a method of sampling for use with image rejection signal processing circuitry, such as used in modern transceiver design.

It is also an object of the present invention to provide a device wherein the method according to the present invention is put into operation.

According to the present invention there is provided a method of sampling an analog signal, comprising the steps of:

a) obtaining In-phase I and Quadrature-phase Q components of the analog signal, the method being characterized by the steps of:

b) obtaining first sequences of discrete sample values of the I and Q components and second sequences of discrete sample values of the and Q components, these first and second sequences being obtained with equal sampling rate and a mutual phase shift of 90° relative to their sampling rate period;

c) summing sample values of the I component of the first sequence and sample values of the Q component of the second sequence, forming a third sequence of sample values;

d) effectively subtracting sample values of the I component of the second sequence from sample values of the Q component of the first sequence, forming a fourth sequence of sample values, and e) repeating steps c) and d) for each sampling rate period.

In the method according to the invention, sequences of discrete sample values of the I and Q components of an analog input signal are obtained, either a baseband signal or a carrier modulated signal. The requirement that both the I and Q components of an analog signal have to be available matches with the image rejection techniques used in circuitry for frequency conversion in transceiver devices.

According to the invention, two sequences of discrete sample values of the I and Q components are obtained with a mutual phase shift of 90°, which may be a phase lead or a phase lag of one sequence with respect to the other.

Selective summation and subtraction of sample values of the I and Q components of both sequences leads to the cancellation of frequency components external to the frequency band of the desired analog signal.

Due to the cancellation or suppression effect according to the present invention, the anti-aliasing filter requirements are considerably relieved, leading to a less higher filter order or, with the same filter as used in conventional AD conversion, to a much less distorted reconstructed output signal. Those skilled in the art will appreciate that relieving the filter requirements is very advantageously from a cost point of view and enhances the possibility of integration of sampling devices on a semiconductor substrate.

The sampled I and Q components obtained according to the method of the present invention may be further processed, among others, by subjecting both the I and Q output components to an ADC operation, such to provide a digital equivalent, for example an 8 or 12 bit representation of the sampled analog signal for further processing thereof in the digital domain.

An analog signal sampling device according to the present invention comprises means for converting an analog signal into In-phase I and Quadrature-phase Q components, characterized by means for converting the I and Q components at a sampling rate into first and second sequences of discrete sample values such that the first and second sequences comprise a mutual phase-shift of 90° relative to their sampling rate period, means for summation of sample values of the I component of the first sequence and sample values of the Q component of the second sequence, outputting a third sequence of sample values, means for summation of negative sample values of the I component of the second sequence and sample values of the Q component of the first sequence, outputting a fourth sequence of sample values, wherein the summation means are arranged to operate at each sampling rate period.

In a preferred embodiment of the device according to the present invention, designed as an ADC, the processing means comprise analog-to-digital converter means, such to provide digital I and Q output signals of the analog input signal, for example.

Instead of subjecting the sampled output components to an ADC operation, each sample obtained may be first AD converted after which the summation and further processing can be accomplished in the digital domain.

The above-mentioned and other features, advantages and applications of the invention are illustrated in the following detailed description with reference to the enclosed drawings.

DETAILED DESCRIPTION OF THE EMBODIMENTS

Figure 1:
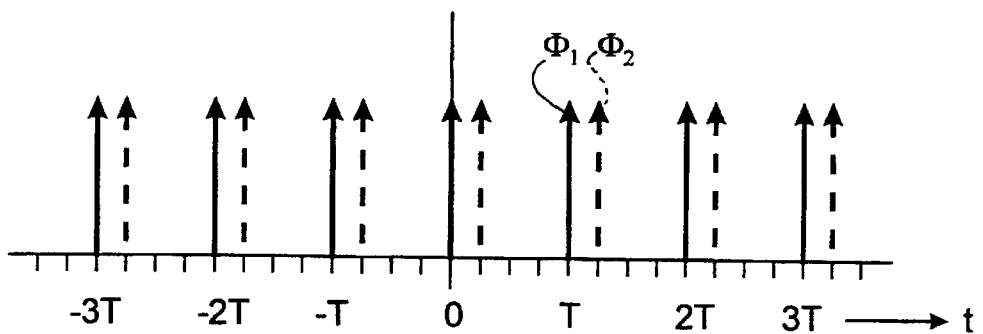
FIG. 1 schematically shows first and second pulse sequences having a mutual 90° phase shift, for sampling of an analog signal in accordance with the present invention.

Without the intention of a limitation, the invention will now be described and illustrated with reference to a baseband analog signal. Further, mathematical knowledge is assumed concerning spectral analysis based on Fourier series and transforms, such as described in the book "Communication Systems", by A. Bruce Carlson, McGraw-Hill, 1975, second edition, in particular chapters 2 and 8.

The sampling operation can be generally expressed as a multiplication of the analog signal to be sampled and a periodic pulse train, such that:

$$S(t)=U(t)\phi(t) \qquad (1)$$

wherein
  U(t)=analog signal to be sampled,
  φ(t)=periodic pulse train, and
  S(t)=the sampled signal.

Assuming ideal sampling, the pulse train becomes a train of impulses, also called unit impulses or Dirac delta functions, which can be expressed as:

$$\phi(t) = \sum_{n=-\infty}^{\infty} \delta(t-nT) \qquad (2)$$

wherein
  δ(t−nT)=an impulse having a unit area located at t=nT, and
  T=the impulse repetition time or sampling period.

The sampling period relates to the sampling rate as:

$$\omega_s = \frac{2\pi}{T} \qquad (3)$$

wherein
  $\omega_s$=sampling rate.

For the purpose of explanation of the present invention, the analog input signal U(t) is expressed as a sinusoidal signal such that:

$$U(t)=A\sin(\omega_0 t) \qquad (4)$$

wherein
  A=amplitude of the signal (in volt or amperes), and
  $\omega_0$=the angular frequency of the signal.

This sinusoidal approach does not put any limitation on the applicability of the invention for a particular type of analog signals because, as will be appreciated by those skilled in the art, each analog signal can be expressed in a series of sinusoidal functions. Now assume:

$$U_I(t)=A\sin(\omega_0 t) \qquad (5)$$

$$U_Q(t)=A\cos(\omega_0 t) \qquad (6)$$

wherein
  $U_I(t)$=In-phase (I) component of U(t), and
  $U_Q(t)$=Quadrature-phase (Q) component of U(t).

Further, the following sampling impulse trains are assumed:

$$\phi_1(t) = \sum_{n=-\infty}^{\infty} \delta(t-nT) \qquad (7)$$

$$\phi_2(t) = \sum_{n=-\infty}^{\infty} \delta\left(t - \left[n+\frac{1}{4}\right]T\right) \qquad (8)$$

From the expressions (7) and (8) it can be seen that the pulse train $\phi_2(t)$ has a 90° phase lag relative to the pulse train $\phi_1(t)$ with respect to the sampling period T, as illustrated in FIG. 1.

In a next step, the I and Q components are sampled using the sampling signals $\phi_1(t)$ and $\phi_2(t)$, which results in first sequences of discrete sample values of the I and Q components, that is $S_I^1(t)$ and $S_Q^1(t)$, respectively, and second sequences of discrete sample values of the I and Q components, that is $S_I^2(t)$ and $S_Q^2(t)$, respectively. Such that:

$$S_I^1(t)=U_I(t)\phi_1(t) \qquad (9)$$

$$S_Q^1(t)=U_Q(t)\phi_1(t) \qquad (10)$$

$$S_I^2(t)=U_I(t)\phi_2(t) \qquad (11)$$

$$S_Q^2(t)=U_Q(t)\phi_2(t) \qquad (12)$$

The above first and second sequences of sample values are than subjected to a summing operation, resulting in third and fourth sequences of discrete sample values, that is $S^3(t)$ and $S^4(t)$, respectively. With the expressions (9)–(12), the summing operation can be expressed as:

$$S^3(t) = S_I^1(t) + S_Q^2(t) = U_I(t)\phi_1(t) + U_Q(t)\phi_2(t) \quad (13)$$

$$S^4(t) = -S_I^2(t) + S_Q^1(t) = -U_I(t)\phi_2(t) + U_Q(t)\phi_1(t) \quad (14)$$

* Note that in expression (14) the negative of the second sequence of discrete values of the I component, i.e. $-S_I^2(t)$ is summed (or effectively subtracted).

Using the expressions (5)–(8) for the I and Q components and the sampling impulse trains $\phi_1(t)$ and $\phi_2(t)$, and under the assumption $\omega_0 \ll \omega_s$ and applying well known trigonometric identities, the third and fourth sequences (13) and (14) can be expressed as:

$$S^3(t) = \qquad (15)$$

$$A\sin(\omega_0 nT) \cdot \sum_{n=-\infty}^{\infty} \delta(t - nT) + A\cos(\omega_0 nT) \cdot \sum_{n=-\infty}^{\infty} \delta\left(t - \left[n + \frac{1}{4}\right]T\right)$$

$$S^4(t) = \qquad (16)$$

$$A\cos(\omega_0 nT) \cdot \sum_{n=-\infty}^{\infty} \delta(t - nT) - A\sin(\omega_0 nT) \cdot \sum_{n=-\infty}^{\infty} \delta\left(t - \left[n + \frac{1}{4}\right]T\right)$$

wherein the bold printed dot indicates a multiplication of the sin or cos term with the respective impulse series.

By examining the expression (15) above, it can be seen that both the first and the second part of the equation represents samples having a value corresponding to the signal value at time $t=nT$, however for the second part this value is only available from time $t=(n+¼)T$. This follows directly from the definition of the Dirac delta function having a unit area concentrated at the discrete point $t=(n+¼)T$. The same holds for the equation (16).

Assuming an ideal Sample-and-Hold (SH) operation, i.e. no degradation of the sample values over the sampling period, and by expressing the equations (15) and (16) as:

$$S^3(t) = I^3(t) + Q^3(t) \qquad (17)$$

$$S^4(t) = Q^4(t) - I^4(t) \qquad (18)$$

with:

$$I^3(t) = A\sin(\omega_0 nT) \cdot \sum_{n=-\infty}^{\infty} \delta(t - nT) \qquad (19)$$

$$I^4(t) = A\sin(\omega_0 nT) \cdot \sum_{n=-\infty}^{\infty} \delta\left(t - \left[n + \frac{1}{4}\right]T\right) \qquad (20)$$

$$Q^3(t) = A\cos(\omega_0 nT) \cdot \sum_{n=-\infty}^{\infty} \delta\left(t - \left[n + \frac{1}{4}\right]T\right) \qquad (21)$$

$$Q^4(t) = A\cos(\omega_0 nT) \cdot \sum_{n=-\infty}^{\infty} \delta(t - nT) \qquad (22)$$

For a particular period, the sampled I component $S_I(t)$ can be obtained by subtracting the above equations (17) and (18) and the sampled Q component $S_Q(t)$ can be obtained by summation of the above equations (17) and (18), however the desired sampled components are only available during part of the sampling period in which the third and fourth sequences of sample values are both available, that is between $t=(n+¼)T$ and $t=(n+1)T$, i.e. in ¾T of the sampling period.

Figure 2:
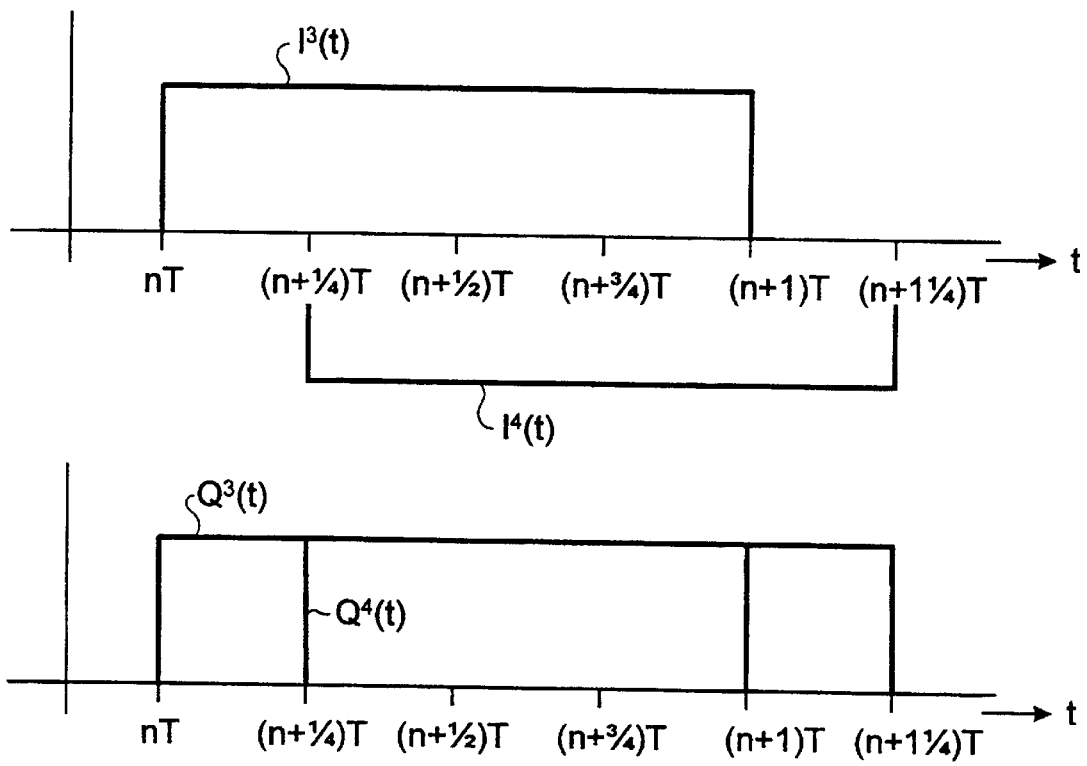
FIG. 2 schematically illustrates sampled signal components of the present invention, for a particular sampling period.

As illustrated in FIG. 2, $I^3(t)$ is available during the sampling period, i.e. between $t=nT$ and $t=(n+1)T$ whereas $I^4(t)$ is only available from a time $t=¼T$ after $I_3(t)$. Likewise, $Q^3(t)$ is available from the start of the period and $Q^4(t)$ is available ¼T after $Q^3(t)$. In FIG. 2, for clarity purposes $I^3(t)$ and $I^4(t)$ and $Q^3(t)$ and $Q^4(t)$ have been indicated in separate graphs, however the signals appear as expressed by the equations (17) and (18).

Substracting $S^3(t)$ and $S^4(t)$ will lead to a complete cancellation of the signals $Q^3(t)$ and $Q^4(t)$ during the above overlapping interval of the sampling period during which $S_I(t)$ is available. Accordingly, further processing of $S_I(t)$ has to be provided during this interval of the sampling period. Likewise, $S_Q(t)$ has to be further processed during this interval of the sampling period in order to reconstruct the sampled Q component.

It will be appreciated by those skilled in the art that the reconstruction of the sampled I and Q components can also be obtained between $t=(n+¾)T$ and $t=(n+1½)T$, in case the sampling impulse train $\phi_2(t)$ has a phase lag of 270° with respect to the sampling impulse train $\phi_1(t)$. Or otherwise expressed, the sampling impulse train $\phi_1$ has a 90° phase lag with respect to $\phi_2(t)$. In both cases, the impulse trains maintain a 90° mutual phase shift.

Now assuming an interfering signal, which can be expressed as:

$$V_I(t) = B \sin[(\omega_s - \omega_i)t] \qquad (23)$$

$$V_Q(t) = B \cos[(\omega_s - \omega_i)t] \qquad (24)$$

wherein

B = amplitude, and $\omega_i$ = angular frequency of the interfering signal.

The interfering signals $V_I(t)$ and $V_Q(t)$ represent the I and Q components of an interfering signal $V(t) = B \sin(\omega_s - \omega_i)t]$ in the desired analog signal, i.e. an interfering signal at a frequency $\omega_i$ below the sample frequency $\omega_s$.

Following the method according to the invention, as discussed above, and by applying relevant trigonometric relations, it can be shown that after sampling and summation of the sample values of the first and second sequences of discrete sample values of the above interfering signal in accordance with (13) and (14) above, the following expressions can be obtained:

$$S_v^3(t) = \qquad (25)$$

$$-B\sin(\omega_1 nT) \cdot \sum_{n=-\infty}^{\infty} \delta(t - nT) + B\sin(\omega_1 nT) \cdot \sum_{n=-\infty}^{\infty} \delta\left(t - \left[n + \frac{1}{4}\right]T\right)$$

$$S_v^4(t) = \qquad (26)$$

$$B\cos(\omega_1 nT) \cdot \sum_{n=-\infty}^{\infty} \delta(t - nT) - B\cos(\omega_1 nT) \cdot \sum_{n=-\infty}^{\infty} \delta\left(t - \left[n + \frac{1}{4}\right]T\right)$$

$S_v^3(t)$ represents the obtained third sequence of sample values of the interfering signal $V(t)$ and $S_v^4(t)$ represents the fourth sequence of sample values of the interfering signal $V(t)$ and the assumption $\omega_0 \ll \omega_s$ has been applied.

Again note that the second parts of the above equations (25) and (26) relate to the actual sample values at $t=nT$, however these values are only available after $t=¼T$ from the start of the sample period, likewise as explained above in connection with expressions (15) and (16).

Accordingly, during ¾ of the sampled period, that is between $t=(n+¼)T$ and $t=(n+1)T$, both $S_v^3(t)$ and $S_v^4(t)$ equal zero. This shows that interfering signals at frequencies $\omega_s - \omega_i$ are cancelled which relieves the requirements on the anti-aliasing filters, as will be further elucidated below.

Thus, following the method according to the present invention, in the interval of a particular period of the third and fourth sequences, which interval starts after the sample values of both the first and second sequences are available, the original or wanted sampled signal can be reconstructed whereas during this interval signals at frequencies outside the desired frequency band are actively cancelled.

Further processing of the sampled I and Q components, such as Analog-to-Digital conversion (AD) has to be accomplished during this interval, thus in ¾ of the time of the sample period T. This time has been reduced by T/4 as compared to conventional sampling. In practice, although the AD conversion has to be completed in a shorter period of time, in the case of baseband signals for audio signals such as speech having an upper frequency of 4 kHz this requirement on the AD operation will not present practical problems.

The AD conversion operation can also be performed directly after the sampling operation, that is on the above signals $S_I^1(t)$ and $S_Q^1(t)$, $S_I^2(t)$ and $S_Q^2(t)$ indicated by the equations (9)–(12). The subsequent summation operations can be performed in the digital domain on the thus converted first and second sequences of digitized sample values. It will be understood that, in such case, the third and fourth sequences of sample values are also sequences of digital sample values.

As an example to show the relieve on the anti-aliasing filter requirements, assume an 8 bits ADC and a sampling frequency which equals four times the maximum signal frequency which has to be AD converted. A suppression of 48 dB for image frequencies, i.e. signals in the first repeated frequency band centered around the sampling frequency, requires approximately a fifth order filter. Applying the method according to the present invention, an image rejection of at least 20 dB may be expected, such that the remaining 28 dB suppression has to be provided by filtering, which equals approximately a third order filter. Accordingly, the order of the filter has been reduced by at least two. By suitable implementation of the method according to the present invention, a higher image rejection is feasible (30 dB without adjustment) resulting in a second order filter.

The performance of the invention is, of course, related to the sampling rate of the sampling process. The best results are obtained if $\omega_s >> \omega_0$, for example $\omega_s \geq 4\omega_0$, i.e. twice the nominal Nyquist rate or higher. The sampling rate should not be less than the nominal Nyquist rate.

Instead of processing baseband signals, the method according to the invention is with like result, i.e. cancellation of interfering signals, applicable for images of the sampled signal at a frequency which is a multiple of the sampling rate. Also called sub-sampling. Summation of (negative) sequences of discrete sample values of the I and Q components have to be performed such to cancel interference signals in the frequency of the required image, i.e. to obtain expressions like (25) and (26) above.

Figure 3:
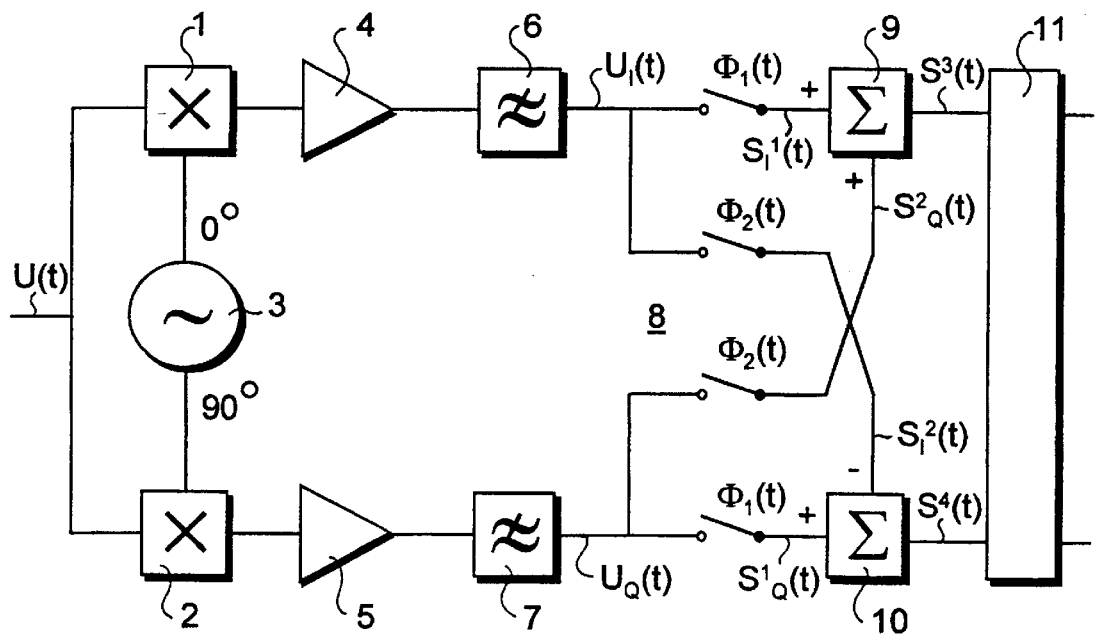
FIG. 3 shows a circuit diagram of an embodiment of a device operating in accordance with the method of the present invention.

An embodiment of a device wherein the method according to the invention is implemented, is shown in FIG. 3.

The device includes a first mixer 1, a second mixer 2, a frequency generator 3, a first amplifier 4, a second amplifier 5, a first filter 6, a second filter 7, Sample-and-Hold (SH) circuitry 8, a summation device 9, a summation device 10 and processing circuitry 11, connected as shown.

The frequency generator 3 provides output signals having a mutual 90° phase shift, such as indicated by 0° and 90° at the respective outputs of the frequency generator 3. Those skilled in the art will appreciate that the required phase shift can also be provided by a 90° phase shifter and a single output frequency generator (not shown).

An incoming signal U(t) is coupled to both the first mixer 1 and the second mixer 2 and mixed with the 0° and 90° outputs of the frequency generator 3, respectively. The output signal of the first mixer 1 is amplified by the first amplifier 4 and filtered by the first filter 6, resulting in the In-phase (I) component $U_I(t)$ of the input analog signal U(t). Similarly, the output signal of the second mixer 2 is amplified by the second amplifier 5 and filtered by the second filter 7 providing the Quadrature (Q) component $U_Q(t)$ of the analog signal U(t).

The above circuitry 1–7 comprise a typical prior art conversion circuit for converting a Radio Frequency (RF) analog input signal $U(t) = A \sin(\omega_c + \omega_0)t$, wherein $\omega_c$ represents an RF carrier frequency, into its baseband I component $U_I(t)$ and Q component $U_Q(t)$. See (5) and (6). In such case, the frequency generator 3 operates at the frequency $\omega_c$.

The first filter 6 and the second filter 7 in the embodiment shown, are Low Pass (LP) filters, also called anti-aliasing filters, in order to filter out undesired high frequency components above the message bandwidth of the analog signal U(t), such to reduce the aliasing effect introduced by sampling of the I and Q components by the SH circuitry 8, as described above.

For clarification purposes, the SH circuitry 8 is simply indicated by switches, which are switched at the sampling rate $\omega_s$ and such that the switches referred to by $\phi_1(t)$ and the switches referred to by $\phi_2(t)$ are operated with a 90° mutual phase shift with respect to the sampling period T following equation (3) above. The switching operations $\phi_1(t)$ and $\phi_2(t)$ can be represented by impulse trains following the equations (7) and (8) above.

The sampled signals, that is $S_I^1(t)$, $S_I^2(t)$, $S_Q^1(t)$, $S_Q^2(t)$ are fed to the summation devices 9 and 10, such that the sample values of the I component $S_I^1(t)$ of the first sequence and the sample values of the Q component $S_Q^2(t)$ of the second sequence are summed by the summation device 9 and the negative sample values of the I component $S_I^2(t)$ of the second sequence are summed with (or effectively substracted from) the sample values of the Q component $S_Q^1(t)$ of the first sequence by the summation device 10. The negative operation at $S_I^2(t)$ is shown with a minus (−) sign at an input of the summation device 10. The summation (and substraction for baseband signals) are performed for each sampling period of the first and second sequences.

The output signal of the summation device 9 is a third sequence $S^3(t)$ of sample values following equation (15) above. The output signal of the summation device 10 is a fourth sequence of sample values $S^4(t)$ following equation (16).

The third and fourth sequences of sample values may be further processed by the processing circuitry 11 such to provide the sampled I component $S_I(t)$ and the sampled Q component $S_Q(t)$ by substraction respectively summation of $S^3(t)$ and $S^4(t)$ during the interval of the sampling period at which both the samples of the first and second sequences are available, as described above. However, the processing circuitry 11 may also comprise further circuitry in which the third and fourth sequences of sample values are further processed following a particular application, for example processing the sampled signals such to drive a loudspeaker, for example.

As described above, due to the image rejection capability of the sampling circuitry 8 and the summation device 9 and substraction device 10, coupled according to the invention, less stringent requirements have to be put on the anti-aliasing filters 6, 7. That is, for achieving a required suppression of image frequencies, the first and second filters 6, 7 may be of a lower order, compared to conventional sampling, wherein the I and Q component are singly sampled. The use of lower order filters is not only of advantage from a cost point of view but also with respect to the processing speed of the circuit. On the other hand, using prior art higher order anti-aliasing filters 6, 7 will, with the present invention, result in a much better suppression of distorting image frequencies, providing a less distorted sampling of signals compared to the referred prior art.

Figure 4:
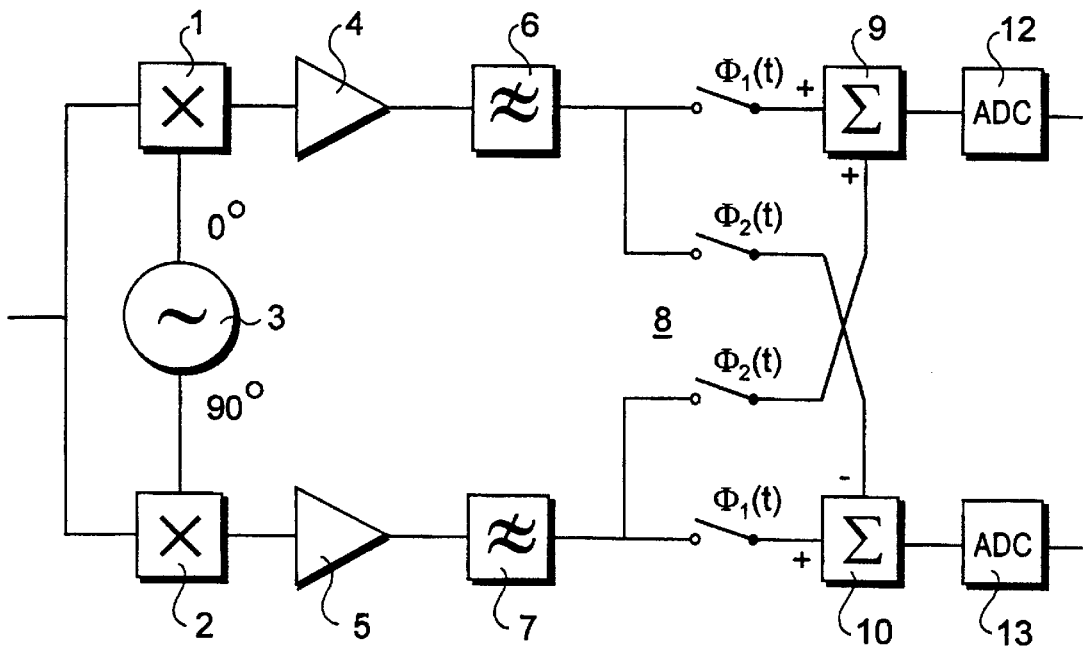
FIG. 4 shows a circuit diagram of a further embodiment of a device operating in accordance with the method of the present invention, designed as an ADC.

The device according to FIG. 3 is completely built from analog circuitry, providing a qualitative amplitude and time discrete representation of an analog signal. However, in modern signal processing, digital representations of analog signals are required, such as provided by the device according to the invention shown in FIG. 4. In this embodiment, the third sequence of sample values $S^3(t)$ outputted by the summation device 9 is fed to an Analog-to-Digital Converter (ADC) 12. Likewise, the fourth sequence of sample values $S^4(t)$ outputted by the summation device 10 is applied to an ADC 13. Both ADC 12 and ADC 13 provide a digital representation of the discrete amplitude of the sample values of the third and fourth sequences, respectively. Such digital representation may be comprised of 8 bit, 12 bit, 16 bit etc., dependend on the accuracy of the ADC 12, 13. As discussed above, to profit as much as possible from the benefits of the present invention, the ADC's 12 and 13 operate on the third and fourth sequences during the interval of the sampling period T when both the samples of the first and second sequences $S_I^1(t)$, $S_I^2(t)$, $S_Q^1(t)$, $S_Q^2(t)$ are available, i.e. the overlapping interval illustrated in FIG. 2.

The output signals of the ADC's 12, 13 may further be processed by digital processing means, such to provide a reconstruction of the sampled I and Q components of the sampled information signal, as well as any other processing required for the purpose of a particular application, such as its use in a digital radio receiver, for example.

Figure 5:
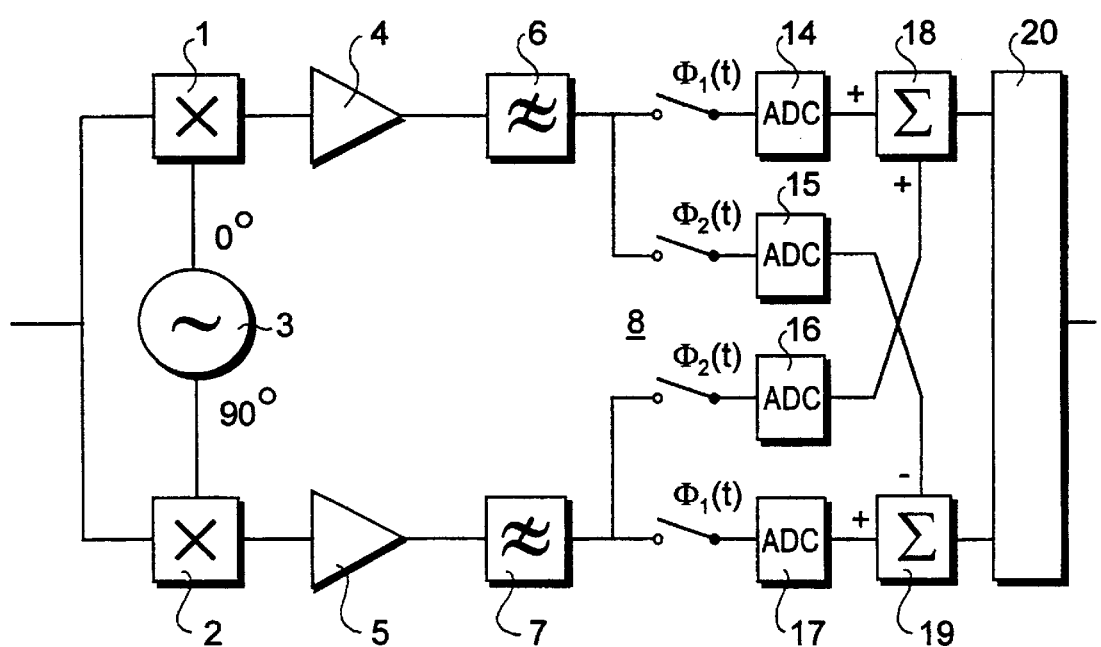
FIG. 5 shows an other embodiment of a device operating in accordance with the present invention providing an ADC operation.

FIG. 5 shows another embodiment of a device operating in accordance with the present invention, wherein the sample values making up the first and second sequences of sample values, that is $S_I^1(t)$, $S_I^2(t)$, $S_Q^1(t)$, $S_Q^2(t)$ are each converted into a digital representation by ADC's 14, 15, 16, 17, respectively. This resulting in first and second sequences of digitized sample values which are summed in the digital domain by digital summation devices 18 and 19, following the method according to the invention as discussed above.

The output signal of the digital summation device 18 is a third sequence of digitized sample values and the output signal of the digital substraction device 19 is a fourth sequence of digitized sample values, like the above third and fourth sequences of discrete sample values $S^3(t)$ and $S^4(t)$. The digital representations of the sample values may be further processed by digital circuitry 20, in accordance with a particular application, for example.

Like the ADC's 12, 13 the ADC's 14, 15, 16, 17 have to complete their conversion before ¾ of the sampling period, if started at the beginning of each new sample of the first and second sequences of sample values. This, in order to be able to sum and substract the converted signals during the overlapping interval of the sampling period, as discussed above.

Although in the above SH circuitry 8 is assumed, those skilled in the art will appreciate that the hold function of the SH circuitry can also be performed by the summation and substraction devices 9, 10 or the ADC's 14, 15, 16, 17, for example.

The device according to the invention is not limited to the sampling of baseband signals in connection with baseband I and Q conversion circuitry 1–7. Such circuitry 1–7 may also be arranged to provide I and Q components at an Intermediate Frequency (IF) or image frequency with sub-sampling, such that the first and second LP filters 6, 7 are to be replaced by band pass filters, for example. Instead of the circuitry 1–7, other means for providing the I component and the Q component of an analog signal can be employed with the sampling, summation and optional ADC and processing circuitry of the present invention.

The method and circuitry of the present invention can be implemented in integrated semiconductor circuits, for example an Application Specific Integrated Circuit (ASIC) for use in communication devices such as modems, radio equipment, in particular mobile and cordless radio equipment operating in the analog and/or digital domain. The operation of such communication devices and components like mixers, filters, summation and substraction circuitry, digital processing circuitry, SH and ADC devices etc. are known to those skilled in the art and need no further detailed explanation.

Those skilled in the art will appreciate that in practice, due to component tolerance spread and/or temperature behaviour, whenever a phase-shift of 90° is mentioned, deviations from this ideal value are understood to be incorporated by the present description and appended claims. Thus, in practice, phase shifts between 85° and 95°, for example, are also included by the term "phase shift of 90°" in the present invention.

The exact behaviour, i.e. the deviation from a desired image rejection for phase shifts other than 90° can be calculated using the equations provided.

What is claimed is:

1. A method of sampling an analog signal, comprising the steps of:

a) obtaining In-phase I and Quadrature-phase Q components of said analog signal, b) obtaining first sequences of discrete sample values of said I and Q components and second sequences of discrete sample values of said I and Q components, said first and second sequences being obtained with equal sampling rate and a mutual phase shift of 90° relative to their sampling rate period;

c) summing sample values of said I component of said first sequence and sample values of said Q component of said second sequence, forming a third sequence of sample values;

d) effectively subtracting sample values of said I component of said second sequence from sample values of said Q component of said first sequence, forming a fourth sequence of sample values, and e) repeating steps c) and d) for each sampling rate period.

2. A method according to claim 1, wherein said third and fourth sequences are processed in an interval of the sampling rate period in which said sample values of said first and second sequences are available.

3. A method according to claim 2, wherein during said interval said sample values of said third and fourth sequences are subjected to analog-digital conversion.

4. A method according to claim 1, wherein at step b) said sample values of said first and second sequences are subjected to analog-digital conversion, such to form first and second sequences of digitized discrete sample values, and wherein said steps c) and d) are performed in the digital domain.

5. An analog signal sampling device, comprising means for converting an analog signal into In-phase I and Quadrature-phase Q components, means for converting said I and Q components at a sampling rate into first and second sequences of discrete sample values such that said first and second sequences comprise a mutual phase-shift of 90° relative to their sampling rate period, means for summation of sample values of said I component of said first sequence and sample values of said Q component of said second sequence, outputting a third sequence of sample values, means for summation of negative sample values of said I component of said second sequence and sample values of said Q component of said first sequence, outputting a fourth sequence of sample values, wherein said summation means are arranged to operate at each sampling rate period.

6. A device according to claim 5, further comprising means for processing said third and fourth sequences in an interval of the sampling rate period in which said sample values of said first and second sequences are available.

7. A device according to claim 6, wherein said processing means comprise analog-digital convertor means.

8. A device according to claim 5, wherein said means for obtaining first and second sequences of discrete sample values comprise analog-digital convertor means for digitizing said discrete sample values and wherein said summation means are digital summation means.

9. A communication device, comprising an analog sampling device having means for converting an analog signal into In-phase I and Quadrature-phase Q components, means for converting said I and Q components at a sampling rate into first and second sequences of discrete sample values such that said first and second sequences comprise a mutual phase-shift of 90° relative to their sampling rate period, means for summation of sample values of said I component of said first sequence and sample values of said Q component of said second sequence, outputting a third sequence of sample values, means for summation of negative sample values of said I component of said second sequence and sample values of said Q component of said first sequence, outputting a fourth sequence of sample values, wherein said summation means are arranged to operate at each sampling rate period, and means for receiving an analog signal, wherein said sampling device is operatively connected for receiving said analog signal.

10. A communication device according to claim 9, wherein said analog signal is an RF signal and said means for receiving said analog signal comprise RF receiver means.

* * * * *